US006115837A

United States Patent [19]
Nguyen et al.

[11] Patent Number: 6,115,837
[45] Date of Patent: Sep. 5, 2000

[54] DUAL-COLUMN SYNDROME GENERATION FOR DVD ERROR CORRECTION USING AN EMBEDDED DRAM

[75] Inventors: Hung Cao Nguyen, San Jose; Son Hong Ho, Los Altos, both of Calif.

[73] Assignee: NeoMagic Corp., Santa Clara, Calif.

[21] Appl. No.: 09/124,334

[22] Filed: Jul. 29, 1998

[51] Int. Cl.$^7$ ................................................. G11C 29/00
[52] U.S. Cl. ........................................ 714/769; 714/756
[58] Field of Search ............................................. 714/769

[56] References Cited

U.S. PATENT DOCUMENTS

| | | | |
|---|---|---|---|
| Re. 30,187 | 1/1980 | Hong et al. ................................. | 714/758 |
| 4,359,772 | 11/1982 | Patel ........................................... | 714/761 |
| 4,412,294 | 10/1983 | Watts et al. ................................ | 707/539 |
| 4,416,010 | 11/1983 | Hibino et al. .............................. | 714/755 |
| 4,564,945 | 1/1986 | Glover et al. .............................. | 714/769 |
| 4,604,750 | 8/1986 | Manton et al. ............................. | 714/764 |
| 4,740,968 | 8/1988 | Aichelmann, Jr. ......................... | 714/703 |
| 4,888,773 | 12/1989 | Arlington et al. ......................... | 714/764 |
| 5,027,357 | 6/1991 | Yu et al. .................................... | 714/758 |
| 5,058,116 | 10/1991 | Chao et al. ................................ | 714/764 |
| 5,212,778 | 5/1993 | Dally et al. ................................ | 711/218 |
| 5,243,604 | 9/1993 | Tsang et al. ............................... | 714/765 |
| 5,268,908 | 12/1993 | Glover et al. .............................. | 714/764 |
| 5,323,402 | 6/1994 | Vaccaro et al. ........................... | 714/782 |
| 5,377,207 | 12/1994 | Perlman .................................... | 714/784 |
| 5,384,786 | 1/1995 | Dudley et al. ............................. | 714/784 |
| 5,422,895 | 6/1995 | Nguyen et al. ............................ | 714/756 |
| 5,465,260 | 11/1995 | Zook .......................................... | 714/758 |
| 5,487,172 | 1/1996 | Hyatt .......................................... | 712/32 |
| 5,490,154 | 2/1996 | Mester ....................................... | 714/764 |
| 5,491,701 | 2/1996 | Zook .......................................... | 714/762 |
| 5,517,509 | 5/1996 | Yoneda ...................................... | 714/785 |
| 5,539,754 | 7/1996 | Zuras, Jr. et al. ......................... | 714/785 |
| 5,588,112 | 12/1996 | Dearth et al. .............................. | 714/9 |
| 5,636,208 | 6/1997 | Chang et al. .............................. | 370/347 |
| 5,650,955 | 7/1997 | Puar et al. ................................. | 365/51 |
| 5,659,713 | 8/1997 | Goodwin et al. ......................... | 714/157 |
| 5,719,884 | 2/1998 | Roth et al. ................................. | 714/755 |
| 5,745,605 | 4/1998 | Bard et al. ................................. | 382/236 |
| 5,778,434 | 7/1998 | Nguyen et al. ............................ | 711/137 |
| 6,041,368 | 3/2000 | Nakatsuji et al. ......................... | 710/20 |
| 6,044,483 | 3/2000 | Chen et al. ................................ | 714/762 |
| 6,047,395 | 4/2000 | Zook .......................................... | 714/756 |

OTHER PUBLICATIONS

Cao, (Higu–Speed Pallelel VLSI–Architecture for the (24, 12) Golay Decoder With Optimized Permutation Decoding, IEEE, 1996).

Maniatopoulos, et al., (Single–Bit Error–Correction Circuit for ATM Interfaces. IEEE, 1995).

(List continued on next page.)

*Primary Examiner*—Albert De Cady
*Assistant Examiner*—Gay Lamarre
*Attorney, Agent, or Firm*—Stuart T. Auvinen

[57] ABSTRACT

A digital-versatile disk (DVD) playback-controller integrated circuit (IC) writes data to a block in an embedded memory buffer. The block has rows and columns. Row syndromes are generated on-the-fly as the data is written from the DVD disk to the memory buffer. Row syndrome generation thus requires no memory access cycles. Once errors in the rows identified by the row syndromes are corrected, column syndromes are generated. A multi-byte fetch supplies a multi-column syndrome generator with bytes in the row for two or more columns. The fetched bytes for the two or more columns are accumulated into intermediate syndromes. Fetched bytes are accumulated for other rows until all of the column's bytes in all rows have been fetched and accumulated. The final accumulated syndromes are output to an error corrector that detects, locates, and corrects any errors in the columns. The same error corrector can be used for row and column syndromes, even though a three-block-deep pipeline is used. Only one memory access cycle is required during column-syndrome generation for each row, even though two or more column syndromes are simultaneously generated. Pipelined registers for the intermediate syndrome bytes in the column-syndrome generator allow syndrome-calculation circuits to be shared for all column syndromes.

20 Claims, 9 Drawing Sheets

OTHER PUBLICATIONS

Saxena, et al., (Syndrome and Transition Count are Uncorrelated. IEEEE, 1988).

Sobski, et al., (Parallel Encoder, Decoder, Detector, Corrector for Cyclic Redundancy Checking, IEEE, 1992).

Sakata, et al., (A Systolic Array Architecture for Implementing a Fast Parallel Decoding Algorithm of One–Point AG Codes. IEEE, 1997).

Liu, et al., (A Fast parallel Implementation of Feng–Rao Algorithm with Systolic Array Structure. IEEE, 1997).

FIG. 1
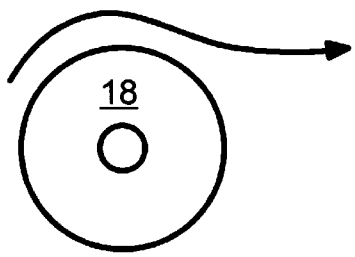
PRIOR ART
| 1 | 2 | ... | 171 | 172 | ECC | ROW 0 |
| 173 | 174 | ... | 343 | 344 | ECC | ROW 1 |
|  |  | ... |  |  |  | ⋮ |
| 32681 | 32682 | ... | 32851 | 32852 | ECC | ROW 191 |
| COL ECC | COL ECC | ... | COL ECC | COL ECC | ECC | ROWS 192-207 |
| COL 0 | COL 1 | ... | COL 170 | COL 171 | COLS 172-181 | |
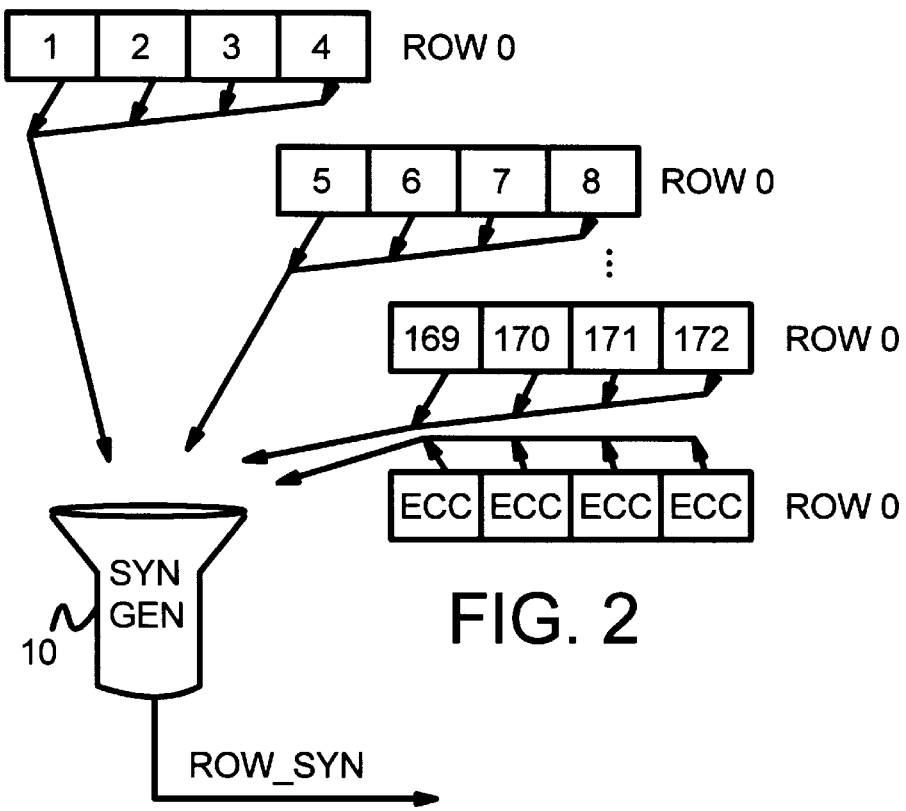
FIG. 2

DUAL-COLUMN SYNDROME GENERATION FOR DVD ERROR CORRECTION USING AN EMBEDDED DRAM

FIELD OF THE INVENTION

This invention relates to error-correction code (ECC) systems, and more particularly to syndrome generation for error correction during digital-versatile disk (DVD) playback.

BACKGROUND OF THE INVENTION

The next generation of optical disks is known as digital-versatile disk (DVD). The CD-ROM drives on laptop and desktop PCs soon will be replaced with DVD drives. DVD has a much higher storage capacity than CD-ROM, enough that an entire motion picture can fit on a single DVD disk.

The large amount of data read during playback and the low-cost reproduction methods of optical disks increase the likelihood of encountering at least some errors on playback. Error detection and correction is thus important for CD-ROM's and DVD's. Smaller amounts of data such as stored in dynamic RAM memory often use parity—a bit is added to each data word so that the expanded word always has even or odd parity. Data from CD's and DVD's are arranged into larger blocks that have error-correction information appended. Multiple error-correction bytes allow errors to not only be detected, but also located and corrected.

FIG. 1 illustrates a DVD data block with error correction for both rows and columns. Data from DVD disk 18 is read sequentially and stored in a block of data. As the data is read from DVD disk 18, it begins filling row 0 with data bytes 1, 2, 3 . . . until 182 bytes have been read. Error-correction information (ECC) for row 0 is contained in the last ten bytes of the row. Data from DVD disk 18 then begins filling the second row (row 1) with data bytes 173, 174, etc. until a second row of 172 data bytes and 10 ECC bytes has been transferred. Additional ECC bytes for the second row are contained in the last 10 bytes of row 1.

Subsequent rows of data and row-ECC information are read from DVD disk 18 and stored in a buffer memory block until all 192 rows of data have been transferred. Finally, sixteen rows of ECC bytes are read. ECC bytes in the final 16 rows are error-correction bytes for columns of data. For example, the first ECC byte in each of the last 16 rows is for column 0, which includes data byte 1 from row 0, data byte 173 from row 1, . . . , and data byte 32681 for data row 191, a total of 192 data bytes, each from a different row.

The final ten bytes of each row in the final 16 rows contains ECC information for the final 16 rows of column ECC bytes. This ensures that errors in the column ECC bytes can be detected and corrected.

Row and Column ECC

The ECC bytes at the end of a row can be used to detect, locate, and correct one or more errors within the row, but do not contain information on errors in other rows. Sometimes errors are too numerous to be detected or corrected in a row. Then the column ECC bytes can be used to find and correct the errors that are uncorrectable by the row ECC bytes. The ECC bytes at the bottom of a column are used to detect, locate, and correct one or more errors within the column, but do not contain information on errors in other columns. Column ECC provides a redundancy to error correction, allowing more difficult errors to be corrected.

Often the data and ECC bytes from the DVD disk are stored in a temporary buffer such as a static RAM buffer. Rows and columns are read to generate syndromes for each row and for each column. Syndromes are signatures or checksums formed by using a pre-defined mathematical operator on all data bytes and ECC bytes of a row or column. Polynomial operators are often used.

The syndromes are then compared to a pre-defined signature of zero to detect any errors in the row or column. The syndromes can often be used to locate and correct a detected error. Complex algorithms such those based on Reed-Solomon code are used with the ECC bytes as is well-known in the art.

Multi-Byte Fetch for Row-Syndrome Generation—FIG. 2

FIG. 2 highlights that multiple bytes can be fetched from buffer memory for row syndrome generation. A syndrome for a row is generated by "summing" all the data and ECC bytes for a row. This "summing" is not a standard addition, but rather a complex signature-generating operation of scaling and adding the 182 bytes in a row. Multiple cycles can be used, such as by adding one byte per cycle to a running scaled sum.

Syndrome generator 10 performs the signature-generating operation as the bytes from the row are input. The buffer memory containing the data block often can read out multiple bytes per cycle. Thus FIG. 2 shows four-byte reads. In a first cycle, bytes 1, 2, 3, 4 are read from the buffer memory and operated on by syndrome generator 10. In a next memory cycle, data bytes 5, 6, 7, 8 are read from memory and accumulated by syndrome generator 10, adjusting the syndrome. Each successive memory cycle can read four bytes at once when the buffer memory is a standard 32-bit memory.

Once all 172 data bytes have been read and accumulated by syndrome generator 10, then the final 10 ECC bytes are read and accumulated. The final accumulated value in syndrome generator 10 is the row syndrome for the current row. Once the row syndrome is latched, syndrome generator 10 is cleared and the process repeated for next row.

The 172 data bytes require 172/4=43 memory access cycles, while the final 10 ECC bytes requires 2.5 memory cycles. A total of 45.5 memory access cycles are required for a 4-byte data-read width. If the buffer memory were able to read 8 bytes per cycle, then the number of cycles required is reduced by half—to 22.75 cycles. Syndrome generator 10 may only accept one byte at a time, but typically its cycle time is much less than the memory access cycle time. Thus syndrome generator 10 can process all four bytes in less that one memory cycle period.

The buffer memory can be physically written in the order shown for FIG. 1, although the row length of the physical memory can differ from that of the data block. Of course, the data and ECC bytes must be written into the buffer memory in order so that the adjacent bytes are for the same row. Otherwise, the four bytes read might not be for the same row.

Single-Byte Fetch for Column Syndrome Generation—FIG. 3

While multi-byte fetches improve row-syndrome performance, column syndromes are not able to benefit from multi-byte fetching. FIG. 3 highlights that column-syndrome generation uses inefficient single-byte fetches.

For column-syndrome generation, all of the bytes in a column are fetched from the buffer memory and input to syndrome generator 10. Only one byte from each row is needed. For column 0, byte 1 of row 0 is 1 fetched and input to syndrome generator 10. Since four bytes are always read, bytes 2, 3, 4 are also read, but not needed.

In the following memory cycle, data byte 173 is read from row 1, along with bytes 174, 175, 176. Only byte 173 is input to syndrome generator 10; fetched bytes 174, 175, 176 are discarded. For each succeeding row, one byte (at column 0) is read and input to syndrome generator 10, while three bytes are fetched and discarded (for columns 1, 2, 3).

Finally the last data byte 32,675 is read from row 191. Then during the next 16 memory cycles the 16 ECC bytes for column 0 are read and input to syndrome generator 10. After the last ECC byte has been read and accumulated by syndrome generator 10, the output from syndrome generator 10 is the column syndrome for column 0. The column syndrome can be latched, syndrome generator 10 cleared, and the process repeated for the second column. Then the second byte is input to syndrome generator 10 and the first, third, and fourth bytes discarded from each 4-byte fetch.

A total of 208 memory access cycles are required to fetch one byte from each of the 208 rows for column-syndrome generation. Using moderately wider fetches does not help, since adjacent bytes in a column are 182 bytes apart in the physical memory, separated by an entire row.

Since the data and ECC bytes are loaded into the buffer memory in row order, accessing just one byte from each row cannot take advantage of multi-byte fetching of wide memories. The adjacent column bytes are not physically adjacent to each other in the buffer memory. Wide memories fetch the multiple bytes from the same row. Also, dynamic memories are often slower to access when changing the physical rows as is often necessary for fetching column data.

What is desired is a high-speed optical-disk playback system. It is desired to use multi-byte fetches of a buffer memory when generating both row and column syndromes. A more efficient column syndrome-generation system is desired. It is desired to improve performance of column syndrome generation and fetching.

SUMMARY OF THE INVENTION

A syndrome generator system for error-correction has a buffer memory that stores a block of data words and error-correction words for the data. The block includes rows and columns. The buffer memory has a multi-column fetch width for reading the data words and error-correction words. The multi-column fetch width is a multiple of words in width.

A multi-column fetcher is coupled to the buffer memory. It reads a first data word in a first column and a second data word in a second column from a row of the block in the buffer memory. The first and second data words are within the multi-column fetch width of each other and both in a same row.

A multi-column syndrome generator is coupled to the multi-column fetcher. It receives first data words from the first column and second data words for the second column from all rows in the block. The multi-column syndrome generator has first registers for storing a first-column syndrome and second registers for storing a second-column syndrome.

A shared calculation circuit in the multi-column syndrome generator combines each first data word with an intermediate first-column syndrome in the first registers to form a next intermediate first-column syndrome that is stored into the first registers. It also combines each second data word with an intermediate second-column syndrome in the second registers to form a next intermediate second-column syndrome that is stored into the second registers.

The next intermediate first-column syndrome is stored in the first register after all first data words from all rows in the block is output as the first-column syndrome. The next intermediate second-column syndrome is stored in the second register after all second data words from all rows in the block is output as the second-column syndrome. Thus the first-column syndrome and the second-column syndrome are generated in a same pass through the multi-column syndrome generator from data words for two columns fetched together from the buffer memory in a same set of memory fetches.

In further aspects of the invention, the multi-column fetch width is at least four data words. The multi-column syndrome generator further generates a third-column syndrome and a fourth-column syndrome from the same set of memory fetches used to generate the first-column syndrome and the second-column syndrome. Thus four columns are processed together, generating four column syndromes in the same pass.

The data words fetched are not stored but are combined in the multi-column syndrome generator with the intermediate column syndromes in the first and second registers before data words from a next row are fetched by the multi-column fetcher.

In still further aspects of the invention, a last set of rows in the block contain error-correction words. The error-correction words are combined in the multi-column syndrome generator into the first-column syndrome and the second-column syndrome.

In other aspects of the invention, the block is read from an optical disk to the buffer memory. Syndromes are generated for a DVD optical disk or a CD-ROM optical disk. When the optical disk is a CD-ROM optical disk, the multi-column syndrome generator receives data words from diagonals for Q-parity syndrome generation. Thus the multi-column syndrome generator is used to generate syndromes for DVD columns and for CD-ROM diagonals.

In further aspects of the invention an error corrector reads the first-column syndrome from the first registers. It detects an error in the first column by examining the first-column syndrome. The error corrector locates and corrects an error detected in the first column by writing to the first column in the buffer memory. In other aspects the error corrector is pipelined with the multi-column syndrome generator.

BRIEF DESCRIPTION OF THE DRAWINGS

FIG. 1 illustrates a DVD data block with error correction for both rows and columns.

FIG. 2 highlights that multiply bytes can be fetched from buffer memory for row syndrome generation.

DETAILED DESCRIPTION

The present invention relates to an improvement in syndrome generation for error correction. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have realized that column-syndrome generation is inherently slowed by the arrangement of data into columns. Performance is limited by the large number of memory fetches needed to fetch just one byte from each row. Additionally, memory bandwidth is occupied by column-syndrome fetching, which reduces the available bandwidth and perhaps increases the average latency for other memory accesses such as disk writes, error correction, and host transfers.

The inventors have further noted the wastefulness of fetching four or more bytes for each row, only to throw away three or more bytes from each fetch since these bytes are for a different column. As wider embedded memories are employed for the buffer memory, the number of wasted bytes increases.

Figure 4:
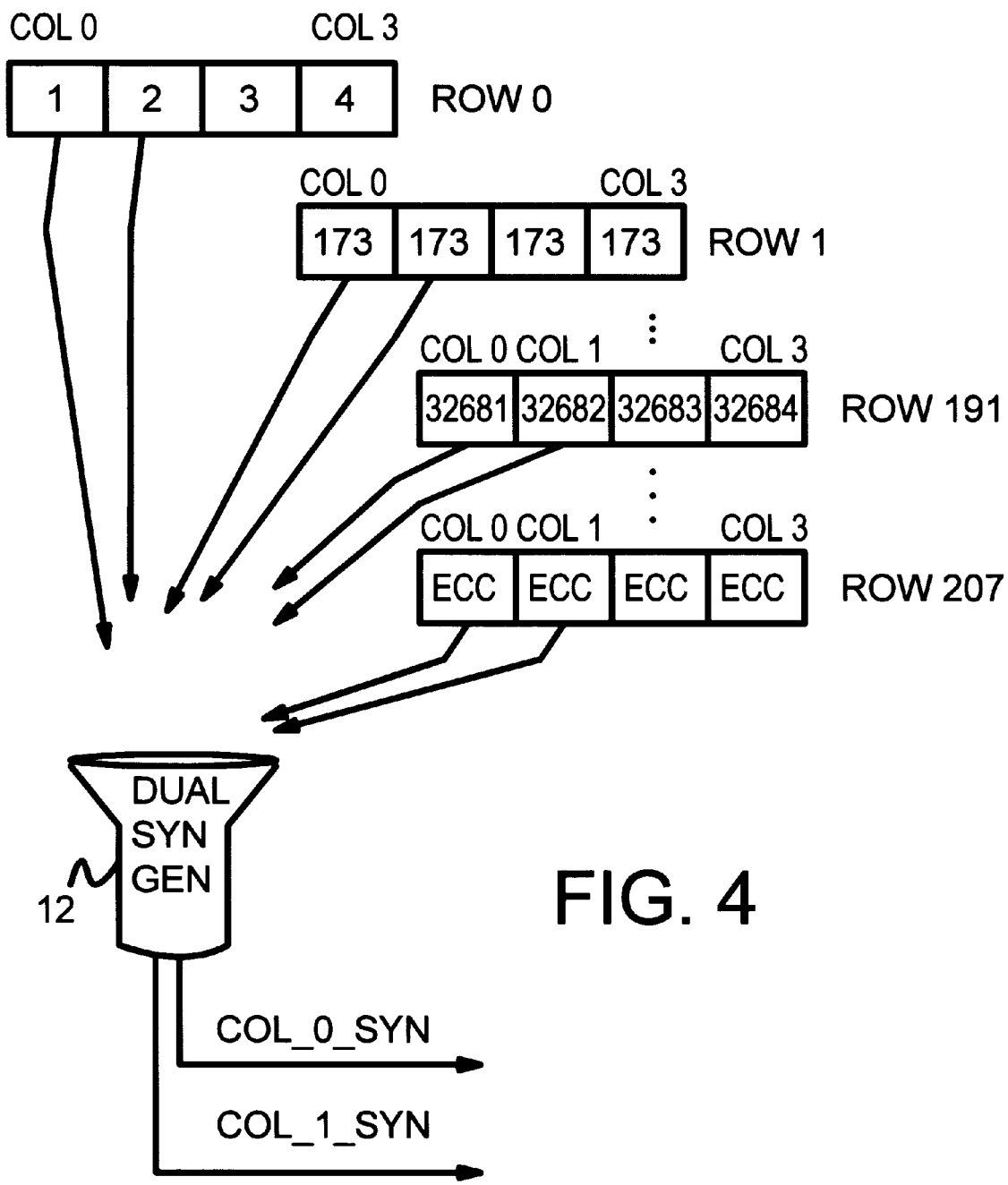
FIG. 4 highlights memory fetching for dual-column syndrome generation.

Dual-Column Fetching—FIG. 4

The inventors have realized that two or more column syndromes can be generated in parallel. This has an immediate benefit of halving the number of memory accesses required for column generation, since each memory fetch supports generation of two column syndromes rather than just one column syndrome. Pairs of columns are processed together rather than separately. The data for the next column is not just prefetched, but also processed concurrently.

FIG. 4 highlights memory fetching for dual-column syndrome generation. Two columns, column 0 and column 1, are processed together. The first four bytes of the first row, row 0, are read from the buffer memory. The first data byte 1 is in the first column while the second data byte 2 is in the second column. The third and fourth bytes in the four-byte fetch are discarded.

The first and second bytes from row 0 are sent to dual-column syndrome generator 12 and accumulated for each column's syndrome. Then the first few bytes of the second row, row 1, are fetched from the buffer memory. The first and second column's data bytes, bytes 173, 174, are input to dual-column syndrome generator 12, while the third and fourth column's data bytes that were fetched are discarded. Data byte 173 is accumulated with the first column's syndrome, while data byte 174 is accumulated with the second column's syndrome.

The first two data bytes of each of the following rows are input to dual-column syndrome generator 12, while the other two bytes of the four-byte memory fetch are discarded. The first and second column's syndromes are altered by each new row's data bytes that are accumulated by dual-column syndrome generator 12. Finally the fetch occurs for the last row of data bytes, row 191. Again the first two data bytes are accumulated by dual-column syndrome generator 12 while the next two bytes are discarded. Then the first two bytes from the next 16 rows are also fetched and accumulated by dual-column syndrome generator 12. These last 16 rows contain the ECC bytes for the columns.

Once the ECC bytes for the last ECC row, row 207, have been accumulated by dual-column syndrome generator 12, the accumulated syndromes are read out of dual-column syndrome generator 12 and latched. Two syndromes are output: the column syndrome for column 0 and the column syndrome for column 1.

Figure 3:
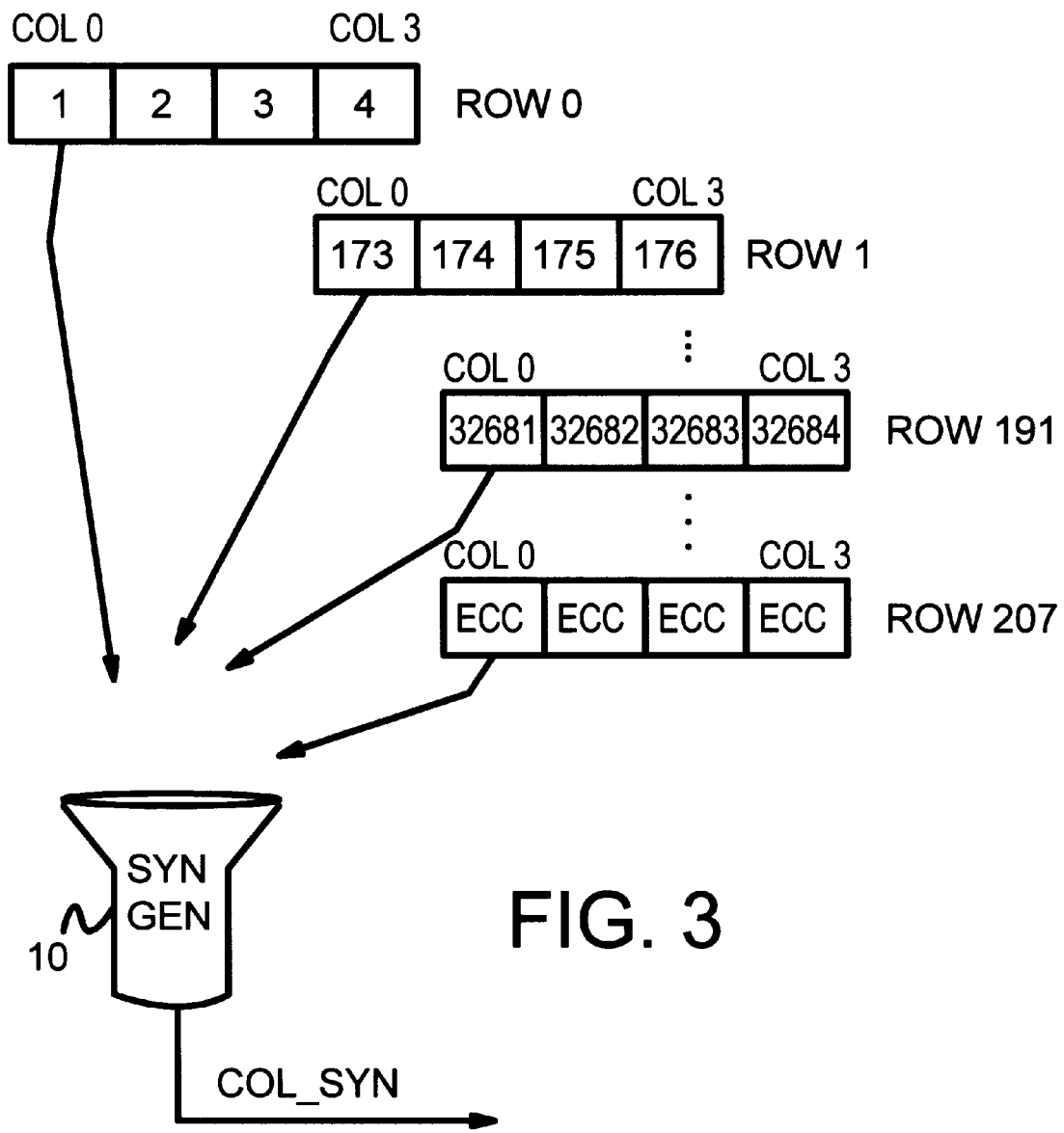
FIG. 3 highlights that column-syndrome generation uses inefficient single-byte fetches.

The total number of memory accesses is equal to the number of rows—208. This is the same number of memory access as required for single-column syndrome generation as shown in FIG. 3. However, two syndromes rather than one are generated. Thus the rate of column syndrome generation is doubled. The total number of memory fetches required to process all 182 columns is cut in half. Since pairs of columns are processed together, only 91 sequences of 208 row fetches are needed.

Dual-column syndrome generator 12 could be two separate syndrome generators. However, this doubles the hardware required for column-syndrome generation. Instead, the inventors have developed a single syndrome generator that can generate two syndromes in parallel at about the same time. Details of the dual-column syndrome generator 12 are shown later in FIG. 9.

Figure 5:
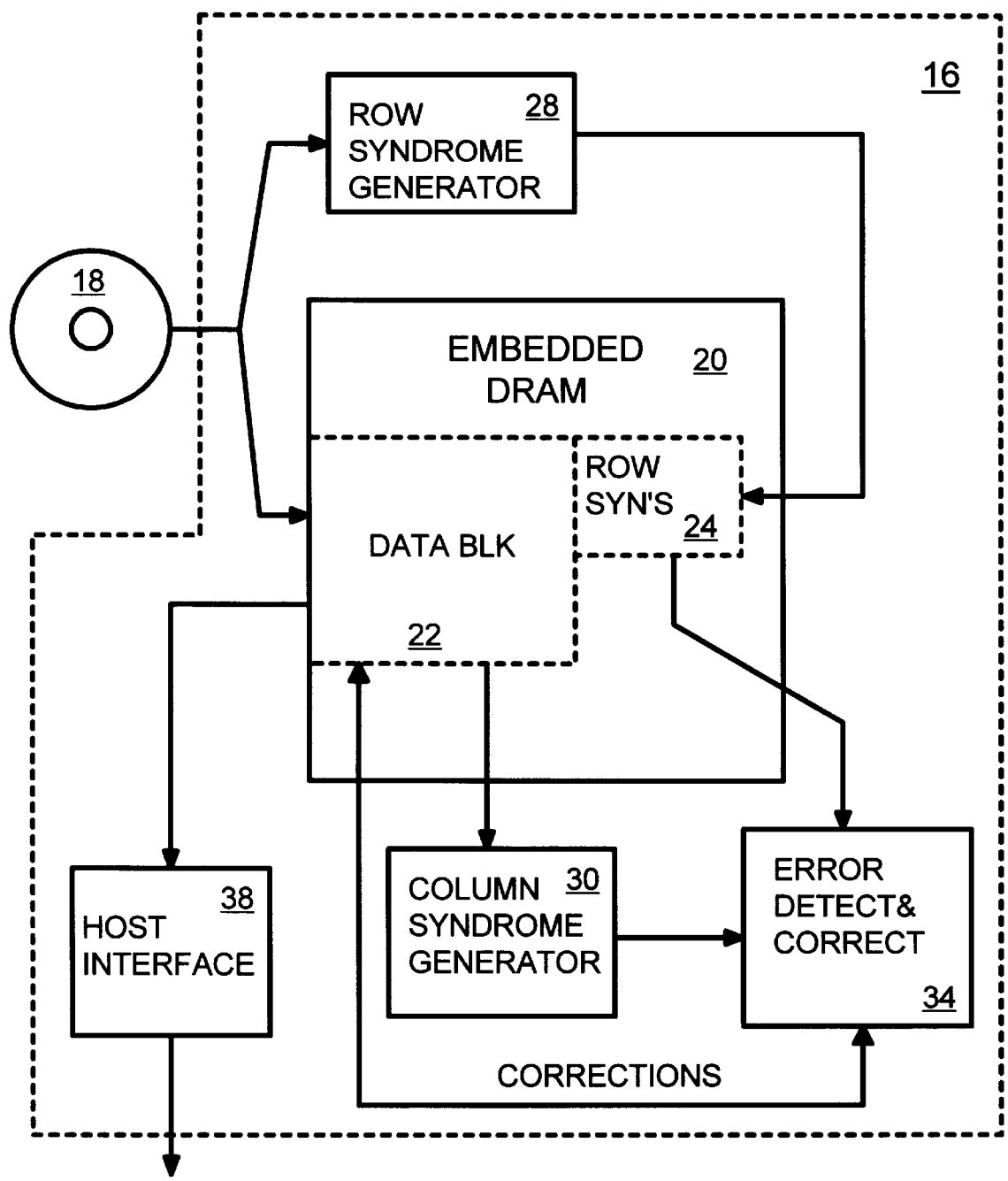
FIG. 5 is a diagram of a DVD controller chip with an embedded DRAM for the buffer memory.

DVD Controller with Embedded DRAM Buffer—FIG. 5

FIG. 5 is a diagram of a DVD controller chip with an embedded DRAM for the buffer memory. Embedded dynamic random-access memories (DRAMs) have been developed by the assignee and widely used in graphics accelerators for notebook personal computers. See for example, "Graphics Controller Integrated Circuit Without Memory Interface", U.S. Pat. No. 5,650,955.

Data is read from DVD disk 18 and into DVD controller chip 16. DVD controller chip 16 is an integrated circuit that may include a DVD controller that interfaces with the electronics of an external DVD disk player. The error correction and data paths of DVD controller chip 16 are shown in FIG. 5 while other portions are not shown.

Embedded DRAM 20 is a large 512-Kbyte memory array within DVD controller chip 16. Dynamic rather than static memory is used to allow for a much larger memory capacity. Since each data block 22 occupies at least 208×182 (37856 bytes including ECC), embedded DRAM 20 can hold 13 data blocks 22. As is shown later in FIG. 6, the large capacity of embedded DRAM 20 allows for pipelining of several data blocks, improving performance. A smaller SRAM memory would not have enough capacity for storing several data blocks in a pipeline. A refresh controller (not shown) refreshes the DRAM.

On-The-Fly Row Syndrome Generation

Data read from DVD disk 18 to DVD controller chip 16 is written to data block 22 in embedded DRAM 20. As each data byte is read into DVD controller chip 16, it is also sent to row syndrome generator 28. Row syndrome generator 28 generates ten row syndrome bytes for the current row being written to embedded DRAM 20 by accumulating each data and row ECC byte into registers storing the row syndrome.

Once the last ECC byte in a row is written to embedded DRAM 20 and accumulated by row syndrome generator 28, the registers in row syndrome generator 28 are copied to embedded DRAM 20 and stored as the row syndrome for the row just written. Pointers are used to locate the current row syndrome being written in row syndrome storage 24 within embedded DRAM 20.

Row syndrome generator 28 is cleared as the next row of data and ECC bytes begins to be read from DVD disk 18. The row syndrome for the next row is generated as row syndrome generator 28 accumulates each byte as each byte is written into data block 22 of embedded DRAM 20. Once all data and ECC rows are written to data block 22, a new area of embedded DRAM 20 is set aside for the next data block. The data stream from DVD disk 18 is then written to rows in the next data block.

Generating the row syndrome as the data is being written to data block 22 of embedded DRAM 20 frees up memory bandwidth since no fetches are needed for row-syndrome generation of data block 22. Data and ECC bytes are simultaneously written to data block 22 of embedded DRAM 20 and to row syndrome generator 28.

Once at least one row of data block 22 has been transferred from DVD disk 18 to embedded DRAM 20, rows are checked for errors and error correction is attempted. Error detector and corrector 34 reads the first row's syndrome bytes from row-syndrome storage 24 of embedded DRAM 20 and compares each byte of the generated row syndrome to a predetermined syndrome of zero for all row syndromes. If the syndromes match, no error is detected and error detector and corrector 34 reads the next row's syndrome from row syndrome storage 24. Each of the ten bytes of a row syndrome must match zero. A non-zero syndrome byte indicates an error in the row.

When error detector and corrector 34 detects an error, error correction is attempted on the row. The location of the error or errors is determined using standard but complex techniques, such as solving a Euclidean Algorithm and Chien search using the generated row syndrome and initial conditions. The error location and the error value (difference) are solved for. See for example, U.S. Pat. No. 5,027,357 by Yu et al. which uses a Reed-Solomon code such as the X3B11 standard and U.S. Pat. No. 5,517,509 by Yoneda that describes decoding ECC and locating errors using Euclid's algorithm and a Chien search.

When error detector and corrector 34 successfully locates an error in the row, the row is corrected by performing a read-modify-write cycle at the location of the error within data block 22 in embedded DRAM 20. Many clock cycles of computation may be required to detect and correct errors. Some detected errors may not be correctable with only the row syndrome. A flag can be set when such uncorrectable errors are detected. The column syndromes are later used to attempt to correct these errors that are not correctable by the row syndromes.

Column Syndrome Generation After Row Corrections

Once the last row of data block 22 has been transferred from DVD disk 18 to embedded DRAM 20, and once error detector and corrector 34 has corrected all rows of data block 22, column syndromes are generated. It is necessary to wait for column-syndrome generation until all possible row corrections have been written to data block 22, since fewer errors will need to be corrected using the column syndromes.

Column syndrome generator 30 reads one or more columns of data from data block 22 and generates one or more column syndromes for the columns read. Since the data and ECC bytes are read from DVD disk 18 and written to embedded DRAM 20 in row order, the bytes in a column are separated by an entire row, 182 bytes. Since this is much larger than the width of the memory fetch, separate fetches are required for each byte in the column. Each of the column's bytes is in a separate row.

Using the dual-column syndrome generation highlighted in FIG. 4, two columns can be processed at the same time. Column syndrome generator 30 fetches multiple bytes from a row in data block 22 in each memory fetch cycle. Two of the fetched bytes are accumulated into the syndromes for two columns, while the other fetched bytes are discarded. After 208 fetches for the 208 rows of a column, the two column syndromes are latched into error detector and corrector 34. Column syndrome generator 30 then fetches the next two columns of data bytes, starting with row 0 of data block 22.

The two column syndromes latched into error detector and corrector 34 are processed serially, since error detector and corrector 34 can only process one column at a time. The first column syndrome is compared to an expected column syndrome. A mismatch detects an error in the column. The location of the error and the correction required are generated by error detector and corrector 34. The correction is made by a read-modify-write cycle to data block 22. Should a column error be uncorrectable, the entire data block can be re-read from DVD disk 18, or the host can be flagged.

Once all column syndromes have been generated, and all columns corrected, error correction is completed for data block 22. Host interface 38 transfers data block 22 to a host interface such as a PCI bus on a personal computer or an internal bus on a TV-set-top DVD player. Host interface 38 ignores the ECC bytes, transferring only the data bytes. Once all rows of data are transferred from embedded DRAM 20 to the host, data block 22 can be marked invalid and the storage area re-used for another data block from DVD disk 18.

Figure 6:
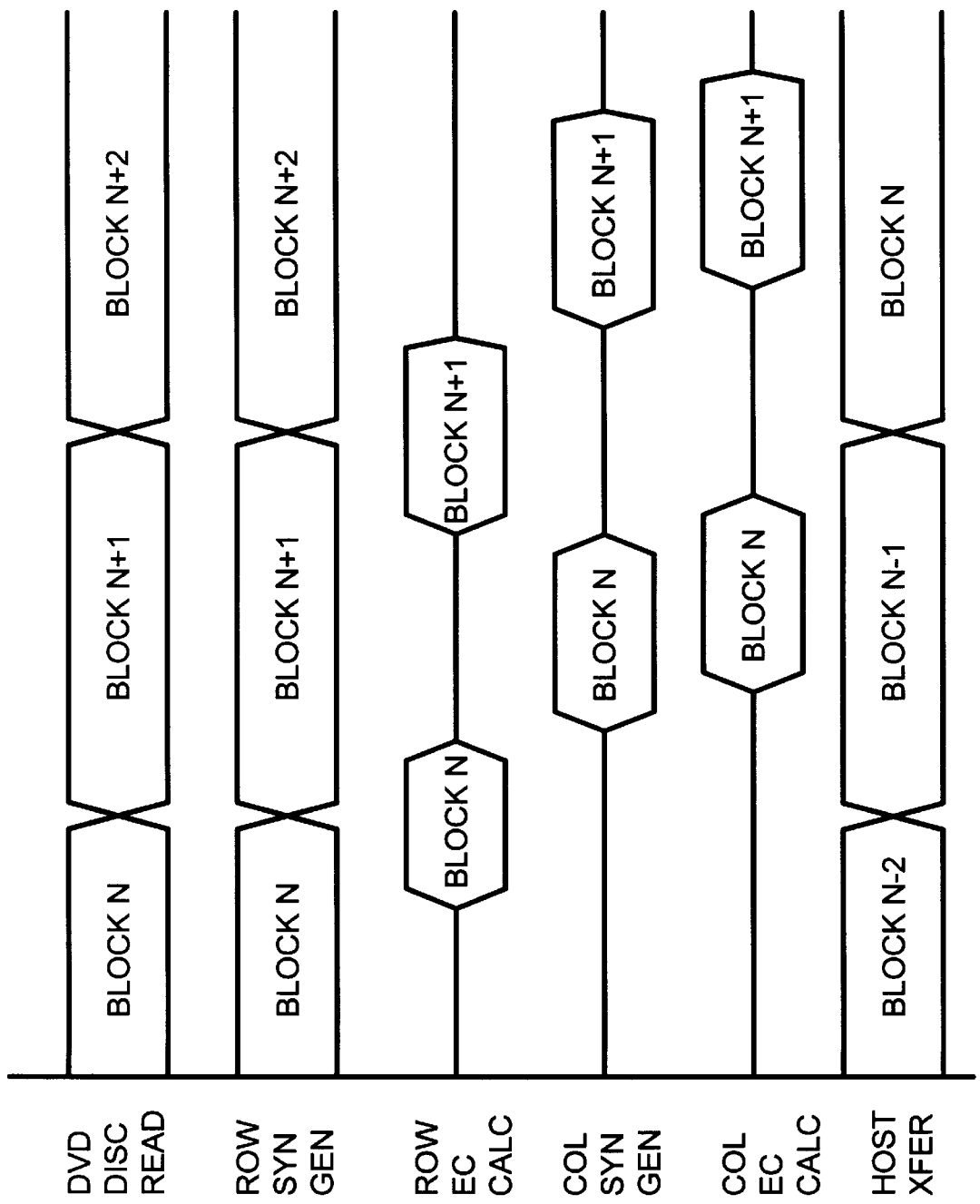
FIG. 6 illustrates the pipelining of blocks of DVD data during error detection and correction.

Pipelining of DVD Blocks—FIG. 6

FIG. 6 illustrates the pipelining of blocks of DVD data during error detection and correction. A DVD block has 208 rows each with a 182 bytes, including ECC bytes. Data and ECC bytes for all 208 rows of DVD block N are read from the DVD disk and written to the embedded DRAM. As each row is read from the DVD disk and written to the embedded DRAM buffer, the row syndrome is generated. Thus all the row syndromes for DVD block N are generated at about the same time the data is read from the DVD disk.

The following DVD blocks N+1 and N+2 likewise are read from the DVD disk and written to the embedded DRAM while the row syndromes are generated and written to the embedded DRAM on the fly. This is shown by the upper two waveforms of FIG. 6.

Error detection and correction (EC) for the rows of DVD block N can begin once at least the first row has been written to the embedded DRAM. As shown in FIG. 6, EC calculations begin near the end of reading block N and continue through while the first rows of next block N+1 are read from the DVD disk. EC calculations require less time than does reading the block from the DVD disk, since reading from the optical DVD disk is relatively slow.

As the row EC calculations are performed, any detected errors are corrected by over-writing the faulty data in the embedded DRAM. Once all row corrections are completed, the partially-corrected DVD block in the embedded DRAM is read, column-by-column, for generating the column syndromes. After each pair of columns is read and its column syndromes generated and latched, the error detector and corrector calculates the error location and error value of any errors in each column. Corrections are written to the columns in the embedded DRAM. Since each column is corrected just after its syndrome is generated, all 182 column syndromes do not have to be stored at the same time. The column EC calculation waveform "COL EC CALC" overlaps the column syndrome generation "COL SYN GEN" waveform but is delayed by one pair of columns.

The error detector and corrector is first used for row error detection and correction for block N, and later used for column error detection and correction for the same clock N. The same error detector and corrector engine is used for both row and column corrections. Column error detection and correction does not occur until the next DVD block N+1 is being read from the DVD disk. The column syndromes for a block are generated while the next block's row syndromes are being generated. Thus row and column syndrome generation is pipelined.

Once all the column corrections are completed, the DVD block is clean and ready to be transferred to the host. Host transfer for DVD block N occurs while DVD block N+2 is being read from the DVD disk to the embedded DRAM. Thus each DVD block is pipelined for a period about equal to the read time for 2 DVD blocks.

Such a pipeline requires that up to 3 DVD blocks be stored in the embedded DRAM buffer, along with the row syndromes for about one and a half blocks. Each block is about 40 Kbytes, with overhead, so a total memory of 120 Kbytes is needed for the 3-block-deep pipeline. This is about a 1-megabit memory.

Figure 7:
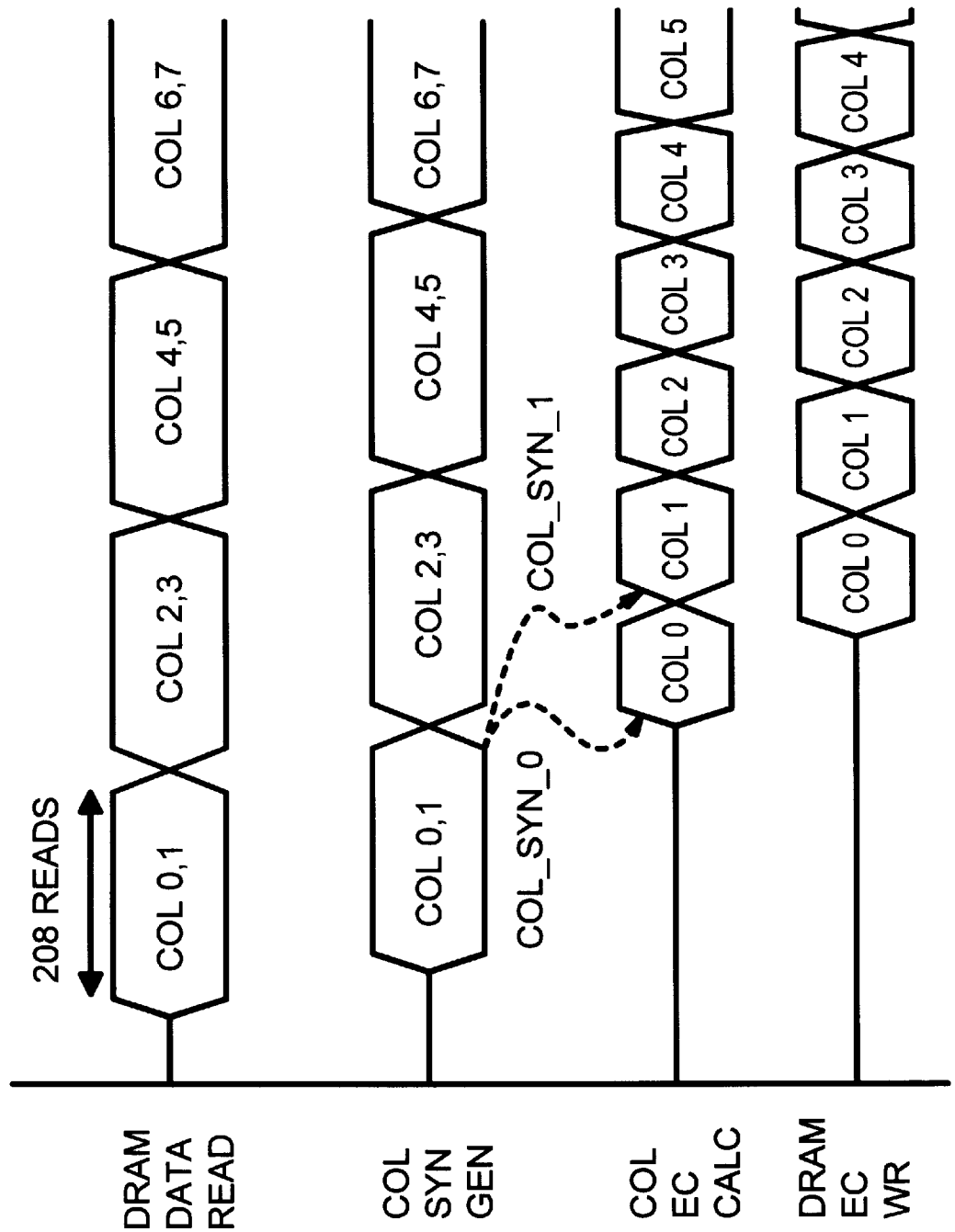
FIG. 7 illustrates pipelining of column-syndrome generation and detection and correction of column errors.

Column Pipelining—FIG. 7

FIG. 7 illustrates pipelining of column-syndrome generation and detection and correction of column errors. Each of the DVD blocks of FIG. 6 contains 182 columns. An exploded view showing how columns within a block are pipelined is shown in FIG. 7.

After all row corrections have been made, data from the partially-corrected DVD block is read on a column basis from the embedded DRAM. Multiple bytes of a row are fetched during each memory access cycle. For dual-column syndrome generation, two of the fetched bytes are accumulated or combined with the two running syndromes in the column syndrome generator. This accumulation is not simply an addition, but is a more complex syndrome-generating operation such as a Reed-Solomon decode.

FIG. 7 shows that the "DRAM DATA READ" fetches bytes in all 208 rows for columns 0,1. After the two bytes from each row are fetched, they are input to the column syndrome generator "COL SYN GEN" and accumulated into the two syndromes. The two bytes for the next row are fetched and accumulated, and the fetching and accumulating into the two syndromes continues until two bytes from all 208 rows are fetched and combined into the two column syndromes.

Note that the bytes from each row are not separately stored; they are simply fetched and combined into the syndromes. Only the two syndromes are stored as they are updated with each new pair of bytes as the 208 rows are fetched. Since each column syndrome is 16 bytes in size, only 32 bytes of register storage is needed, not 416 bytes for the whole 2 columns.

The two final syndromes are latched after all 208 rows are read from the embedded DRAM. Then one of the column syndromes is sent from the latch to the error detector and corrector. The error detector and corrector compares the column syndrome to an expected value to detect any errors, and then locates and corrects any detected error. The error correction is latched into a write buffer and then a read-modify-write cycle corrects the data in the embedded DRAM as shown in the "DRAM EC WR" waveform.

Once the first column has been corrected by the error detector and corrector, the first column's syndrome is discarded and the second column's syndrome is read from the latch. The error detector and corrector then detects any error in the second column and makes the correction by latching the address and data for the correction into the write buffer.

The error detector and corrector (waveform "COL EC CALC") operates serially on two columns, COL 0 and COL 1, while the column syndrome generator (waveform "COL SYN GEN") reads the next two columns COL 2,3 from the embedded DRAM and generates the next two column syndromes. Thus the error detector and corrector is pipelined with the DRAM fetching and column syndrome generation.

Pipelining thus occurs on both the column and the block levels. This pipelining allows for a higher throughput. The pipeline can be stalled when a resource is not available, such as when the embedded DRAM cannot be read or written due to another transfer in progress, or when a complex correction is being performed by the error detector and corrector.

Figure 8:
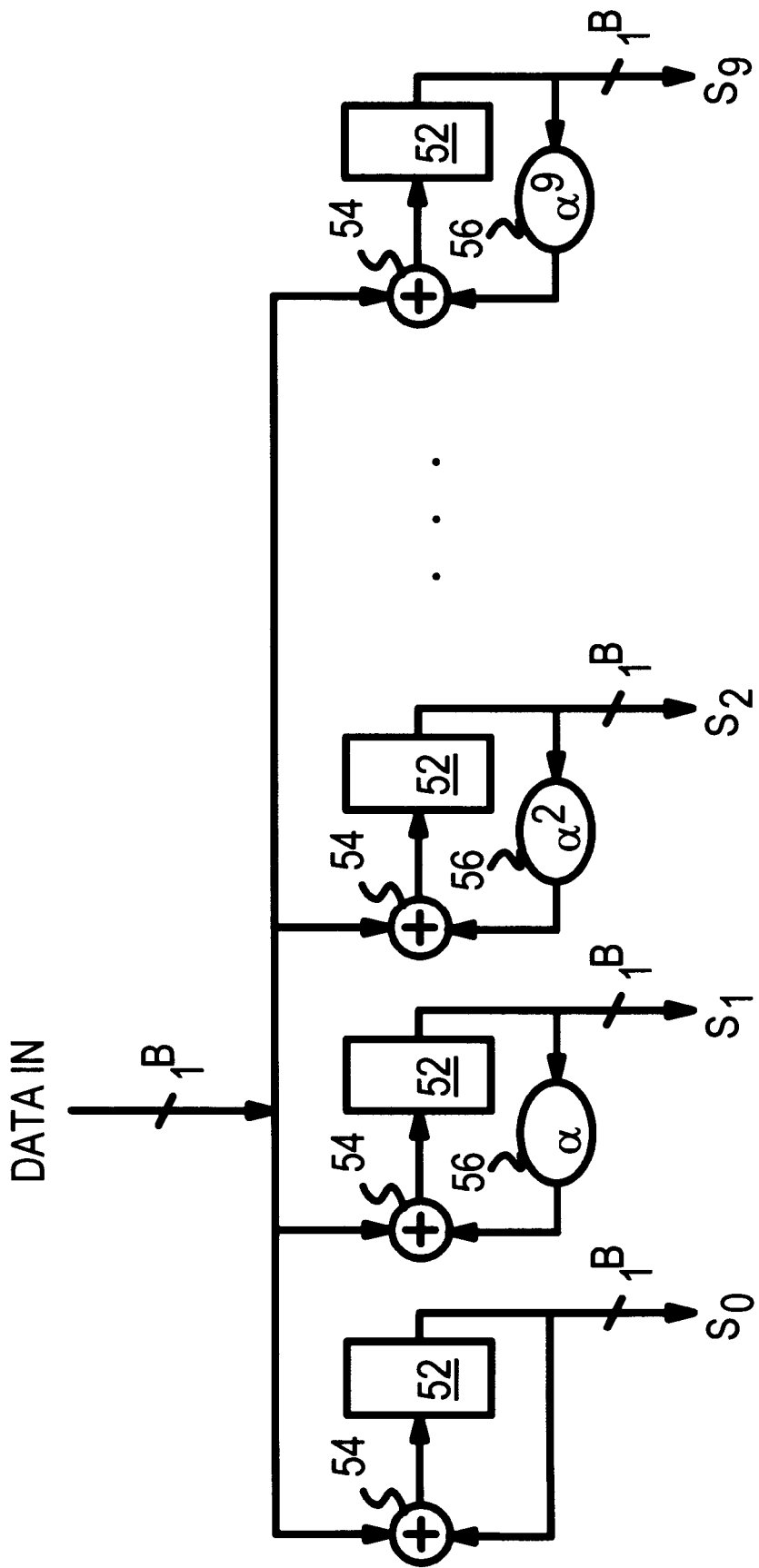
FIG. 8 is a schematic diagram of a row-syndrome generator.

Row Syndrome Generator—FIG. 8

FIG. 8 is a schematic diagram of a row-syndrome generator. The entire row of 172 data bytes and 10 ECC bytes is considered one codeword for syndrome generation. Each row, including both the data and appended ECC bytes, is a Reed-Solomon codeword that is first decoded by syndrome generation. The code is based on a proprietary polynomial generator described in the DVD specification.

The row code is a Reed-Solomon (n,k)=(182,172) code that can be reduced from the 182 input bytes to a 10-byte (n−k) syndrome. The generated syndrome is in some ways like a compressed cyclical-redundancy checksum. The first data byte is considered the most-significant-byte (MSB) of the 182-byte codeword, while the final ECC byte of the row is the least-significant-byte (LSB).

The MSB of the row, the first data byte, enters the row syndrome generator first. After calculations are made, the next byte in the row enters the syndrome generator and is accumulated into the syndrome generated from the first byte by performing more calculations. Then the third byte in the row is input to the syndrome generator and accumulated into the syndrome generated from the first and second bytes. Each successive byte in the row is successively input to the row-syndrome generator and alters the syndrome being generated. Once all data and ECC bytes have been input to the syndrome generator, the finally value of the 10-byte syndrome is read out of registers in the row-syndrome generator.

The row syndrome is represented by the syndrome polynomial:

$$S(x) = S_9 x^9 + S_8 x^8 + \ldots + S_1 x + S_0.$$

where the ten coefficients $S_j$ are the ten bytes read out of the registers at the end of syndrome generation for a row. Each of the ten syndrome coefficients is thus an 8-bit byte, representing a value in a 256-element Galois field. Coefficient $S_9$ is the most-significant byte while coefficient $S_0$ is the least-significant byte of the 10-byte row syndrome.

The $S_j$ coefficients are calculated from the row codeword $r(x)$ as $S_j = r(x)$ where $x = \alpha^j$, or $S_j = r(\alpha^j)$. The row codeword $r(x)$ is:

$$r(x) = r_{181} x^{181} + r_{180} x^{180} + \ldots + r_2 x^2 + r_1 x + r_0$$

where $r_{181}$ is the first data byte (MSB) in the row, $r_{180}$ is the second data byte, $r_1$ is the second-to-last ECC byte in the row, and $r_0$ is the last ECC byte in the row, the LSB. When calculating each syndrome coefficient $S_j$, the variable x is replaced with $\alpha^j$.

Thus since j=0 for $S_0$, and $\alpha^0$ is 1, the least-significant syndrome coefficient $S_0$ is $$S_0 = r_{181} + r_{180} + \ldots + r_2 + r_1 + r_0.$$

The second-least-significant syndrome coefficient $S_1$ is $$S_1 = r_{181} \alpha^{181} + r_{180} \alpha^{180} + \ldots + r_2 \alpha^2 + r_1 \alpha + r_0.$$

Having j=9, the most-significant syndrome coefficient $S_9$ is $$S_9 = r \alpha^{181 \cdot 9} + r_{180} \alpha^{180 \cdot 9} + \ldots + r_2 \alpha^{2 \cdot 9} + r_1 \alpha^9 + r_0.$$

FIG. 8 shows the row-syndrome generator circuit that implements these equations to generate the ten syndrome coefficients $S_9$ to $S_0$. Each of the 182 data and ECC bytes for the row are input as a byte on the DATA IN bus. These bytes are input one after the other, so 182 clock cycles are required to input the entire row of bytes. Each byte being input is sent to all ten adders 54 to be combined or accumulated with intermediate syndrome coefficients stored in registers 52. These intermediate syndrome coefficients stored in registers 52 are first scaled by multipliers 56. All registers are initialized with zero values.

The scaling constants increase with higher-order coefficients. For example, intermediate coefficient $S_9$ from the right-most register 52 is scaled by $\alpha^9$ in multiplier 56 before being added to the next data or ECC byte input. However, intermediate coefficient $S_2$ from register 52 is scaled by $\alpha^2$ in its multiplier 56 before being added to the next data or ECC byte input. The least-significant coefficient $S_0$ is scaled by $\alpha^0$, which is simply 1, requiring no multiplier.

The final syndrome coefficients in registers 52 after all 182 bytes in the row are input during 182 clock cycles are the final row-syndrome coefficients. For the least-significant coefficient $S_0$, each of the 182 bytes are added to the running sum in the left-most register 52. This implements the equation:

$$S_0 = r_{181} + r_{180} + \ldots + r_2 + r_1 + r_0.$$

For the next least-significant coefficient $S_1$, each of the 182 bytes are added to the running sum in the next-left-most register 52. The running sum from register 52 is first scaled by $\alpha$ for each iteration or new byte added. Thus the last ECC byte is simply added while the second-to-last ECC byte $r_1$ is multiplied by $\alpha$ only once. The third-to-last ECC byte $r_2$ is multiplied by $\alpha$ twice, or $\alpha^2$. The first-input, most-significant byte, $r_{181}$ is looped from register 52 through multiplier 56 181 times, so byte $r_{181}$ is effectively multiplied by $\alpha^{181}$. This implements the equation:

$$S_1 = r_{181}\alpha^{181} + r_{180}\alpha^{180} + \ldots + r_2\alpha^2 r_2\alpha^2 + r_1\alpha + r_0.$$

Likewise, the most-significant coefficient $S_9$ multiplies the intermediate coefficient stored in the right-most register 52 by $\alpha^9$ for each loop. The last ECC byte is not multiplied by $\alpha^9$, but the second-to-last ECC byte is multiplied by $\alpha^9$ just once. The third-to-last ECC byte is multiplied by $\alpha^9$ twice. The first-input, most-significant byte, $r_{181}$ is looped from register 52 through multiplier 56 and multiplied by $\alpha^9$ a total of 181 times, so byte $r_{181}$ is effectively multiplied by $\alpha^{181*9}$. This implements the equation:

$$S_9 = r_{181}\alpha^{181*9} + r_{180}\alpha^{180*9} + \ldots + r_2\alpha^{2*9} + r_1\alpha^9 + r_0.$$

Thus the circuits for row-syndrome generator 28 in FIG. 8 generate the ten syndrome coefficients by iterating over all 182 input bytes from a row.

Figure 9:
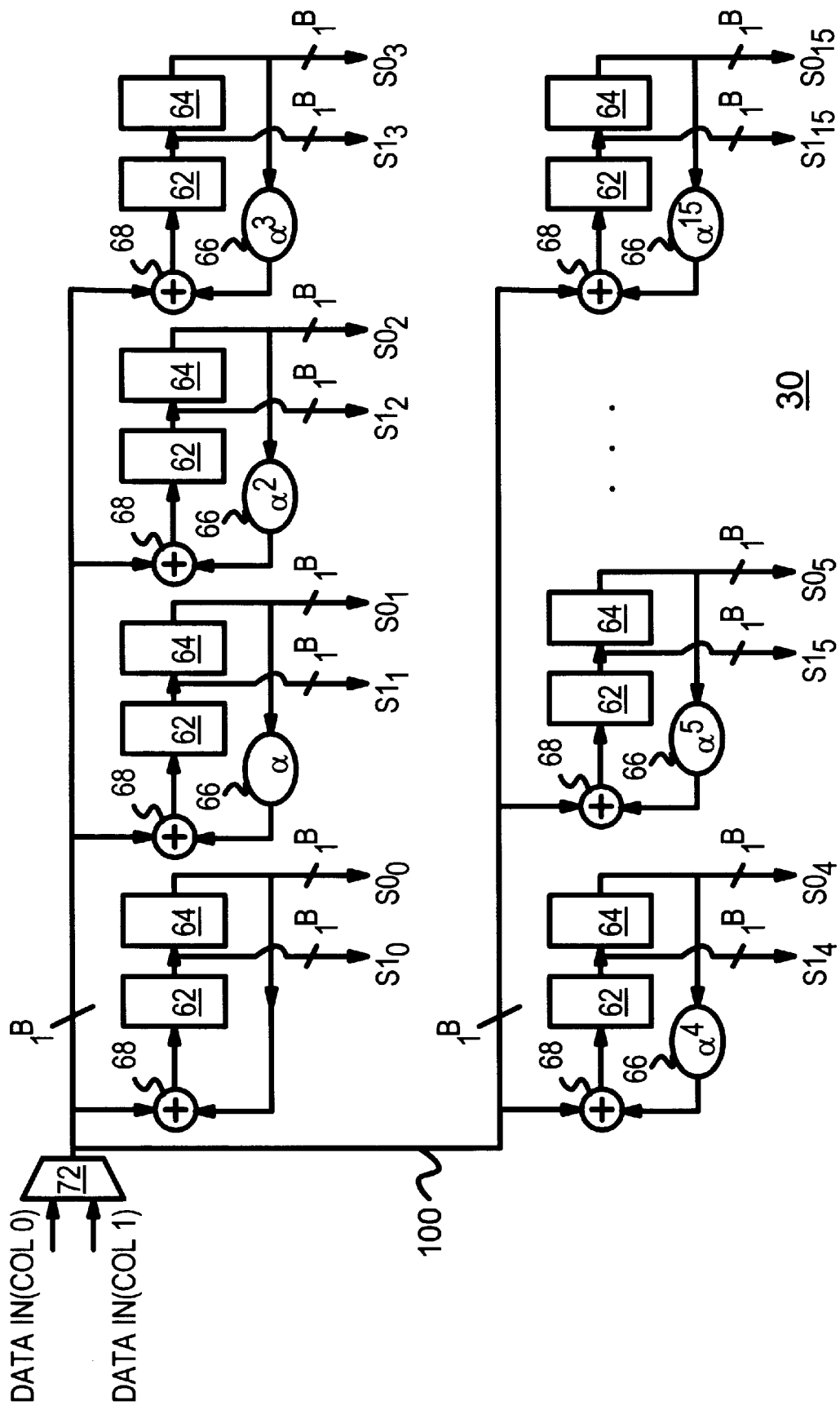
FIG. 9 is a schematic of a dual-column syndrome generator.

Dual-Column Syndrome Generation—FIG. 9

The row syndrome generator of FIG. 8 could be extended from 10 to 16 stages to output a 16-byte column syndrome. Column syndromes use a (208,192) Reed-Solomon code for the 208 rows. The column syndrome has 16 bytes while the row syndrome had only ten bytes. Thus an additional six stages are needed for column-syndrome generation.

Processing two columns in parallel could be accomplished by using two independent 16-stage syndrome generators. However, doubling all circuitry, including the multipliers and adders, can significantly add to the cost of the circuit. The inventors instead have developed an integrated syndrome generator that can generate two syndromes together. One pass of memory fetches can be used to generate two or more syndromes rather than just one syndrome.

FIG. 9 is a schematic of a dual-column syndrome generator. Bytes from two columns that are fetched together from the same row are multiplexed onto bus 100 by mux 72. First the data or ECC byte from the even column (COL 0) is selected by mux 71 and input to the adders 68 over bus 100. Adders 68 combine the new byte from bus 100 with the intermediate syndrome bytes stored in registers 64, after being scaled by a power of $\alpha$ in multipliers 66.

The new intermediate syndrome bytes for the even column are generated by adders 68 and latched into registers 62. The last intermediate syndrome bytes for the other (odd) column were stored in registers 62, but now are transferred to registers 64. Registers 62, 64 are pipelined, with one set of registers containing the intermediate syndrome for one of the columns, while the other set of registers holding the intermediate syndrome for the other column.

Once the even column's fetched byte has been accumulated through adders 64 into registers 62, then mux 72 selects the other (odd) column's byte (DATA IN COL 1) that was fetched in the same memory access cycle as the even column's byte that was just accumulated into registers 62. The odd column's fetched byte is transferred from bus 100 to adders 68. The previous intermediate syndrome for the odd column is output from registers 64 and scaled by a power of $\alpha$ by multipliers 66 before being added to the newly fetched byte in adders 68. The same byte from bus 100 is added in each stage by adders 68.

On the next clock edge, the newly-generated intermediate syndrome bytes from adders 68 are latched into the first registers 62, while the even column's intermediate syndrome that was stored in first registers 62 is transferred to second registers 64.

Two clock cycles of the calculation clock to registers 62, 64 are needed for every memory access cycle. In the first of every pair of calculation-clock cycles, the even column's intermediate syndrome from second registers 64 is combined with the newly fetched byte in adders 68. On the clock edge, the new intermediate syndrome for the even column from adders 68 is latched into first registers 62, while the intermediate syndrome for the odd column is transferred from first registers 62 to second registers 64. Then in the second calculation-clock cycle, the odd column's intermediate syndrome from second registers 64 is combined with the newly fetched byte of the odd column in adders 68. On the second clock edge, the new intermediate odd-column syndrome from adders 68 is latched into first registers 62, while the intermediate syndrome for the even column is transferred from first registers 62 to second registers 64. The next pair of bytes from the next row can be fetched and input to mux 72, repeating the process.

After pairs of bytes for the even and odd columns have been fetched for all 208 rows and accumulated into registers 62, 64, the final column syndromes are contained in registers 62, 64. The even column's syndrome is read from registers 64, while the odd column's syndrome is read from registers 62. The sixteen syndrome bytes for the even column are labeled $S0_0$ to $S0_{15}$, while the odd column's syndrome bytes are labeled $S1_0$ to $S1_{15}$. FIG. 9 labels these syndromes as for columns 0, 1, but all 182 columns are processed in pairs in the same manner as columns 0, 1 by dual-column syndrome generator 30.

Once final the even and odd column syndromes are read out or latched elsewhere, registers 62, 64 are cleared. Then the next pair of even and odd columns can be processed, starting with fetching the bytes from the first row, and continuing for all 208 rows.

Figure 10:
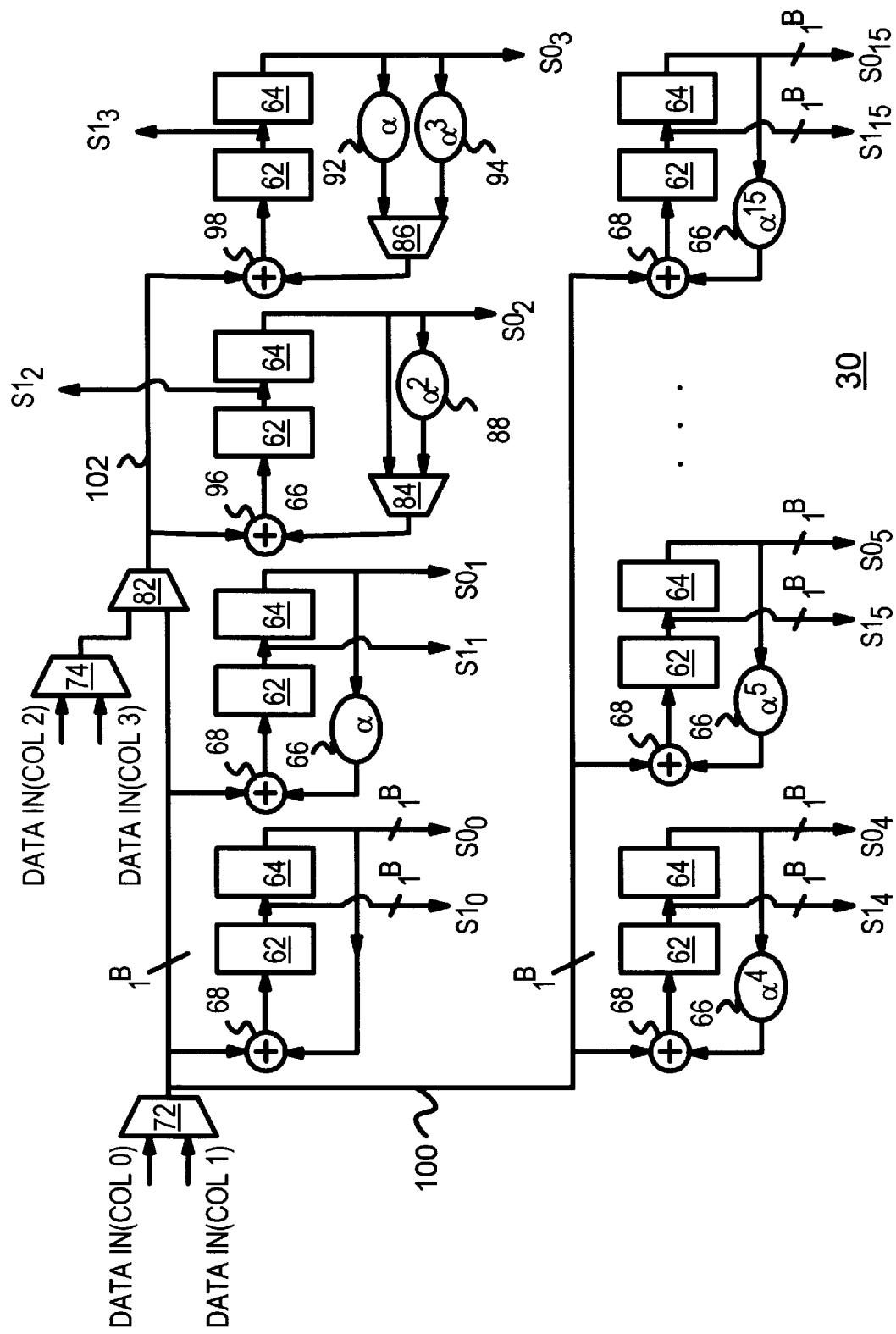
FIG. 10 shows a column syndrome generator for generating multiple columns of DVD or CD-ROM codes.

Dual-Column Syndrome Generator For DVD or CD-ROM—FIG. 10

The dual-column syndrome generator 30 of FIG. 9 can be modified to generate not just the 16-byte DVD-code syndromes, but also 4-byte CD-code syndromes used for many earlier CD-ROMs. FIG. 10 shows a column syndrome generator for generating multiple columns of DVD codes or multiple columns and diagonals of CD-ROM codes.

Muxes 82, 84, 86 select their bottom inputs when a DVD code is being processed. Mux 84 selects multiplier 88 so that syndrome bytes $S0_2$ and $S1_2$ are generated by scaling the last intermediate syndrome byte 2 by $\alpha^2$. Likewise, mux 86 selects multiplier 94 so that syndrome bytes $S0_3$ and $S1_3$ are generated by scaling the last intermediate syndrome byte 3 by $\alpha^3$. Mux 82 feeds the even or odd column's fetched bytes from mux 72 and bus 100 to bus 102 so they can be accumulated for syndrome coefficients 2 and 3. With these muxes 82, 84, 86 set for DVD mode, the operation of dual-column syndrome generator 30 operates as described for FIG. 9. Adders 96, 98 on bus 102 operate as do adders 68 on bus 100. Sixteen bytes of each column syndrome are output once bytes fetched from all 208 rows are accumulated.

For CD mode, only four bytes of syndrome are generated, since CD-ROMs use a (26,24) P-vector code and a (45,43) Q-vector code. Each requires only two syndrome bytes. The upper 12 stages on bus 100 of the DVD syndrome are not used for CD mode. The same Galois field is used for CD and DVD coding, allowing some circuitry to be shared.

For P-vector (column) CD mode, four input bytes are available on DATA IN COL0,1,2,3 to muxes 72, 74. In the first clock cycle, the column 0 byte from mux 72 is input on bus 100 to adders 68, but only the lowest two stages are used, syndrome bytes 0 and 1. In the second clock cycle, the 2-bytes of intermediate syndrome for column 0 are shifted to registers 64, while column 1's byte is input through mux 72 to bus 100, and accumulated by adders 68 into registers 62.

Syndromes for columns 2 and 3 are generated in the same clock cycles that columns 0 and 1 are. Mux 74 selects column 2's byte to bus 102 when mux 72 selects column 0's byte to bus 100, but mux selects column 3's byte to bus 102 when mux 72 selects column 1's byte. Mux 84 bypasses multiplier 88 so that the third stage acts as a LSB stage that simply accumulates the fetched bytes without scaling. Mux 86 selects multiplier 92 for CD mode, scaling the last intermediate syndrome by $\alpha$ rather than by $\alpha^3$. Thus stage four acts like a second stage.

Four syndromes are generated for P-vector CD mode. After all rows are processed, column 0's syndrome is stored in registers 64 of the first and second stages ($S0_0$, $S0_1$), while column 1's syndrome is stored in registers 62 of the first and second stages ($S1_0$, $S1_1$). Column 2's syndrome is stored in registers 64 of the third and fourth stages ($S0_2$, $S0_3$), while column 3's syndrome is stored in registers 62 of the third and fourth stages ($S1_2$, $S1_3$).

For Q-vector (diagonal) CD mode, only two diagonals are processes together instead of four. Bus 102 is not used. Only the first two stages are used.

Galois Field Circuits

The addition performed by adders 68 of FIGS. 8, 9, 10 is limited to a 256-element Galois Field GF(256), that can be represented by an 8-bit byte. Adders 68 perform a bit-wise exclusive-OR (XOR) with no carries to conform to Galois-field addition. Multipliers 66 likewise operate in the Galois field, performing a Galois field multiply.

ADVANTAGES OF THE INVENTION

A high-speed optical-disk playback system is accomplished by using the multi-byte fetches of a buffer memory when generating both row and column syndromes. Multiple columns of data are prefetched with no additional delay by using multi-byte fetching. The column syndrome-generator operates on multiple columns of data, generating multiple column syndromes in about the same time as required to generate one syndrome. Performance of column syndrome generation is thus improved. Less fetching is required, freeing memory bandwidth for other uses such as host or disk transfers.

As long as the number of column syndromes co-generated is equal to or less than the byte-width of the memory access, the total number of memory accesses is equal to the number of rows—208. This is the same number of memory access as required for single-column syndrome generation, but multiple column syndromes are generated instead of just one. Thus the rate of column syndrome generation is doubled, quadrupled, or increased by the number of simultaneous columns processed. The total number of memory fetches required to process all 182 columns is cut in half when two columns are processed together. When pairs of columns are processed together, only 91 sequences of 208 row fetches are needed.

The dual-column syndrome generator could be two separate syndrome generators. However, this doubles the hardware required for column-syndrome generation. Instead, the inventors have developed a single syndrome generator that can generate two syndromes in parallel at about the same time. This dual-syndrome generator processes a second column for a hardware cost of only 16 byte-registers and a byte-mux.

Each additional column increases the hardware by just 16 byte-registers and a larger mux, plus a 16-byte latch for each additional column-syndrome stored. Thus the column-syndrome generator can easily be scaled to higher throughputs as higher-speed DVD drives are used. Since faster DVD drives are contemplated, higher throughputs will be required of future products. The invention easily scales up throughput of column-syndrome generation as needed.

ALTERNATE EMBODIMENTS

Several other embodiments are contemplated by the inventors. For example FIFO buffers or pipeline latches can be inserted into the circuitry at many points, such as to and from the embedded memory. XNOR rather than XOR gates can be used in the adder, and an extra inverter added in the registers. Other circuit implementations are possible too. Many variations of Reed-Solomon code can be used for the ECC bytes as the invention is not limited to a certain type of coding or error-correction methods.

Different polynomial generators for the Reed-Solomon code can be used, as can different Galois fields. While the term byte has been used with reference to an 8-bit quantity, it should be realized that other data widths can be used. For example, it is possible that future DVD systems will operate on two or four-byte data words or fields. Each column is then the width of one data word or field.

While a four-byte fetch or read from the buffer memory has been described, other fetch sizes can be used with the invention. With embedded memories in particular, much larger fetch sizes are common. For example, a 128-bit (16-byte) interface is used by the assignee for an embedded memory in a graphics controller, and a 256-bit (32-byte) interface is contemplated. Such a wide interface is practical for embedded memories but not for external memories because package pins on the chip are not needed for the memory interface when embedded memories are used.

When wider embedded memories are used, the dual-column syndrome generator can be expanded to process more columns or CD diagonals in parallel. A quad-column syndrome generator is constructed by using four register stages rather than two registers 62, 64 for each syndrome byte, as shown in FIGS. 9, 10. The dual-column syndrome generator can thus be easily scaled up to operate on multiple columns simply by increasing the depth of syndrome-storage registers for each syndrome byte. Each additional column generated requires only 16 additional byte-wide registers. The XOR and scaling logic is shared for all columns.

The fetch size is typically defined by the width in bytes of the interface between the memory and other circuits. Sometimes this width can vary, perhaps being larger for the host or disk interface but smaller for interfaces to ECC blocks.

Timing of the various pipelined blocks can be controlled by a central controller. Flags or bits can be set or cleared upon completion of tasks for a block, such as completion of reading from the DVD disk, completion of generation of all the row syndromes, row error correction, etc. DVD-RAMs that are writeable can be used when the invention is modified for writing as well as reading data from the disk. The invention may be adapted for future extensions of DVD or future optical disk standards. The invention can also be applied to non-computer DVD systems, such as consumer electronics DVD video players.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A syndrome generator system for error-correction comprising:

a buffer memory storing a block of data words and error-correction words for the data, the block including rows and columns, the buffer memory having a multi-column fetch width for reading the data words and error-correction words, the multi-column fetch width being a multiple of words in width;

a multi-column fetcher, coupled to the buffer memory, for reading a first data word in a first column and a second data word in a second column from a row of the block in the buffer memory, the first and second data words being within the multi-column fetch width of each other and both in a same row;

a multi-column syndrome generator, coupled to the multi-column fetcher, for receiving first data words from the first column and second data words for the second column from all rows in the block, the multi-column syndrome generator having first registers for storing a first-column syndrome and second registers for storing a second-column syndrome;

a shared calculation circuit, in the multi-column syndrome generator, for combining each first data word with an intermediate first-column syndrome in the first registers to form a next intermediate first-column syndrome that is stored into the first registers, and for combining each second data word with an intermediate second-column syndrome in the second registers to form a next intermediate second-column syndrome that is stored into the second registers, wherein the next intermediate first-column syndrome stored in the first register after all first data words from all rows in the block is output as the first-column syndrome; and wherein the next intermediate second-column syndrome stored in the second register after all second data words from all rows in the block is output as the second-column syndrome, whereby the first-column syndrome and the second-column syndrome are generated in a same pass through the multi-column syndrome generator from data words for two columns fetched together from the buffer memory in a same set of memory fetches.

2. The syndrome generator system of claim 1 wherein the multi-column fetch width is at least four data words, and wherein the multi-column syndrome generator further generates a third-column syndrome and a fourth-column syndrome from the same set of memory fetches used to generate the first-column syndrome and the second-column syndrome, whereby four columns are processed together, generating four column syndromes in the same pass.

3. The syndrome generator system of claim 2 wherein the data words fetched are not stored but are combined in the multi-column syndrome generator with the intermediate column syndromes in the first and second registers before data words from a next row are fetched by the multi-column fetcher.

4. The syndrome generator system of claim 3 wherein the data words are bytes of data.

5. The syndrome generator system of claim 1 wherein a last set of rows in the block contain error-correction words, the error-correction words being combined in the multi-column syndrome generator into the first-column syndrome and the second-column syndrome.

6. The syndrome generator system of claim 1 wherein the block is read from an optical disk to the buffer memory, wherein syndromes are generated for a DVD optical disk or a CD-ROM optical disk, wherein when the optical disk is a CD-ROM optical disk, the multi-column syndrome generator receives data words from diagonals for Q-parity syndrome generation, whereby the multi-column syndrome generator is used to generate syndromes for DVD columns and for CD-ROM diagonals.

7. The syndrome generator system of claim 1 further comprising:

an error corrector, reading the first-column syndrome from the first registers, for detecting an error in the first column by examining the first-column syndrome, the error corrector locating and correcting an error detected in the first column by writing to the first column in the buffer memory.

8. The syndrome generator system of claim 7 wherein the error corrector further detects, locates, and corrects errors in all columns by examining column syndromes from each column and writing to the buffer memory.

9. The syndrome generator system of claim 8 wherein the error corrector operates on the second-column syndrome after it operates on the first-column syndrome, and wherein the multi-column syndrome generator generates the first-column syndrome and the second-column syndrome in parallel in the same pass, whereby the error corrector serially processes column syndromes, by the multi-column syndrome generator and the multi-column fetcher processes multiple columns in parallel.

10. The syndrome generator system of claim 9 wherein the error corrector operates on the second-column syndrome while the multi-column syndrome generator and the multi-column fetcher are processing additional columns in a next pass after a first pass,
whereby the error corrector is pipelined with the multi-column syndrome generator.

11. The syndrome generator system of claim 7 further comprising:
a row-syndrome generator, coupled to the error corrector, for generating a row syndrome for each row in the block, the row-syndrome generator outputting each row syndrome to the error corrector, the error corrector detecting, locating, and correcting errors in the row by writing to the row in the buffer memory.

12. The syndrome generator system of claim 11 wherein the row-syndrome generator does not read the data words from the buffer memory, the row-syndrome generator receiving the data words from an optical disk being read when the data words are written to the buffer memory,
whereby row syndromes are generated on-the-fly, but column syndromes are generated by fetching the data words from the buffer memory.

13. The syndrome generator system of claim 12 wherein the error corrector corrects errors for all rows of the block before the multi-column fetcher fetches data words from the block,
whereby the data words in the block are first corrected using the row syndromes before the column syndromes are generated.

14. The syndrome generator system of claim 1 wherein the buffer memory is an embedded memory on a same integrated circuit chip as the multi-column syndrome generator.

15. A method of playback of data from a DVD disk comprising:
reading a block of data from the DVD disk by writing a data stream from the DVD disk to rows of a block in a buffer memory;
as each current row of the block of the buffer memory is being transferred from the DVD disk to the buffer memory:
also sending the current row of data to a row-syndrome generator;
generating a row syndrome for the current row without reading the data from the buffer memory;
sending the row syndrome to an error corrector, the error corrector examining the row syndrome to detect an error in the current row;
correcting errors detected in the current row by writing corrected data to the current row at a location determined from the row syndrome;
wherein the block becomes a row-corrected block once all rows have been corrected;
after all rows of the block have been transferred from the DVD disk to the buffer memory:
transferring a next block to the buffer memory and generating row syndromes and making row corrections for the next block;
wherein a pass includes exactly one single memory access of each of the rows;
for each pass, processing at least two columns including a first column and a second column in the row-corrected block by:
for each row of the row-corrected block:
in a single memory-access cycle, reading multiple data bytes from a row;
sending at least two of the multiple data bytes to a multi-syndrome generator;
accumulating in the multi-syndrome generator a first of the at least two of the multiple data bytes into a first column syndrome;
accumulating in the multi-syndrome generator a second of the at least two of the multiple data bytes into a second column syndrome;
after reading the multiple data bytes from all rows in the row-corrected block, outputting the first column syndrome to the error corrector;
using the first column syndrome in the error corrector to detect, evaluate, locate, and correct any errors in a first column;
outputting the second column syndrome to the error corrector;
using the second column syndrome in the error corrector to detect, evaluate, locate, and correct any errors in a second column; and
wherein after all columns have been corrected the row-corrected block becomes a row-and-column-corrected block;
transferring the row-and-column-corrected block to a host,
whereby row and column syndrome generation is pipelined and whereby two column syndromes are generated for each pass.

16. A dual-column syndrome generator comprising:
a plurality of stages, each stage for generating a byte of a column syndrome;
an internal bus for transferring an input byte to each of the plurality of stages during a clock cycle;
an input mux receiving multiple bytes of a row in a coded block, the multiple bytes being fetched together in a single memory-access cycle from a buffer memory containing the coded block, the input mux outputting a first byte of the multiple bytes to the internal bus as the input byte during a first clock cycle but outputting a second byte of the multiple bytes to the internal bus as the input byte during a second clock cycle;
wherein the first byte is in a first column and the second byte is in a second column of the coded block, wherein the first byte and the second byte are in a same row of the coded block;
each of the plurality of stages including:
a combiner, receiving the input byte from the internal bus, for combining the input byte with a feedback byte;
a first register, coupled to the combiner, for storing an output of the combiner as a first intermediate syndrome byte;
a second register, coupled to an output of the first register, for storing a second intermediate syndrome byte; and
a scaler, coupled to an output of the second register, for scaling the second intermediate syndrome byte by a power of a constant to produce the feedback byte to the combiner;
wherein after all bytes of the first and second columns are fetched from all rows in the coded block and applied to the input mux and the internal bus, the first register in each stage contains a final syndrome byte for the second column while the second register in each stage contains a final syndrome byte for the first column,
whereby two column syndromes are generated together by the dual-column syndrome generator.

17. The dual-column syndrome generator of claim 16 wherein the two column syndromes are generated from bytes fetched from only one memory access cycle for each of the rows of the coded block.

18. The dual-column syndrome generator of claim 17 wherein each stage in the plurality of stages contains a scaler that scales by a different power of the constant.

19. The dual-column syndrome generator of claim 18 wherein the combiner is a bit-wise adder.

20. The dual-column syndrome generator of claim 19 wherein the scaler is a Galois Field multiplier.

* * * * *